US012641804B2

(12) United States Patent
Sen Gupta et al.

(10) Patent No.: US 12,641,804 B2
(45) Date of Patent: May 26, 2026

(54) CAPACITOR DEVICES WITH STRONTIUM TITANATE INSULATOR LAYERS

(71) Applicant: Intel Corporation, Santa Clara, CA (US)

(72) Inventors: Arnab Sen Gupta, Beaverton, OR (US); Kaan Oguz, Portland, OR (US); Chia-Ching Lin, Portland, OR (US); I-Cheng Tung, Hillsboro, OR (US); Sudarat Lee, Hillsboro, OR (US); Sou-Chi Chang, Portland, OR (US); Matthew V. Metz, Portland, OR (US); Scott B. Clendenning, Portland, OR (US); Uygar E. Avci, Portland, OR (US); Ian A. Young, Portland, OR (US); Jason C. Retasket, Beaverton, OR (US); Edward O. Johnson, Jr., Saint Helens, OR (US)

(73) Assignee: Intel Corporation, Santa Clara, CA (US)

( * ) Notice: Subject to any disclaimer, the term of this patent is extended or adjusted under 35 U.S.C. 154(b) by 343 days.

(21) Appl. No.: 17/666,745

(22) Filed: Feb. 8, 2022

(65) Prior Publication Data

US 2023/0253444 A1     Aug. 10, 2023

(51) Int. Cl.
*H10D 1/68*     (2025.01)
*H10D 1/00*     (2025.01)

(52) U.S. Cl.
CPC ............. *H10D 1/694* (2025.01); *H10D 1/042* (2025.01); *H10D 1/684* (2025.01); *H10D 1/696* (2025.01); *H10D 1/716* (2025.01)

(58) Field of Classification Search
CPC .......... H10D 1/694; H10D 1/42; H10D 1/684; H10D 1/696; H10D 1/716
See application file for complete search history.

(56) References Cited

U.S. PATENT DOCUMENTS

| | | | | | |
|---|---|---|---|---|---|
| 11,482,270 | B1 * | 10/2022 | Dokania | ................. | H10B 53/30 |
| 2015/0069481 | A1 * | 3/2015 | Sun | ......................... | H10D 1/684 |
| | | | | | 257/295 |
| 2015/0294702 | A1 * | 10/2015 | Lee | ...................... | G11C 11/1659 |
| | | | | | 365/51 |
| 2019/0115353 | A1 * | 4/2019 | O'Brien | ............... | H10D 30/701 |
| 2020/0395460 | A1 * | 12/2020 | Haratipour | ........... | H10D 64/689 |

* cited by examiner

*Primary Examiner* — Omar F Mojaddedi
(74) *Attorney, Agent, or Firm* — Akona IP PC

(57) ABSTRACT

Described herein are capacitor devices formed using perovskite insulators. In one example, a perovskite templating material is formed over an electrode, and a perovskite insulator layer is grown over the templating material. The templating material improves the crystal structure and electrical properties in the perovskite insulator layer. One or both electrodes may be ruthenium. In another example, a perovskite insulator layer is formed between two layers of indium tin oxide (ITO), with the ITO layers forming the capacitor electrodes.

17 Claims, 7 Drawing Sheets

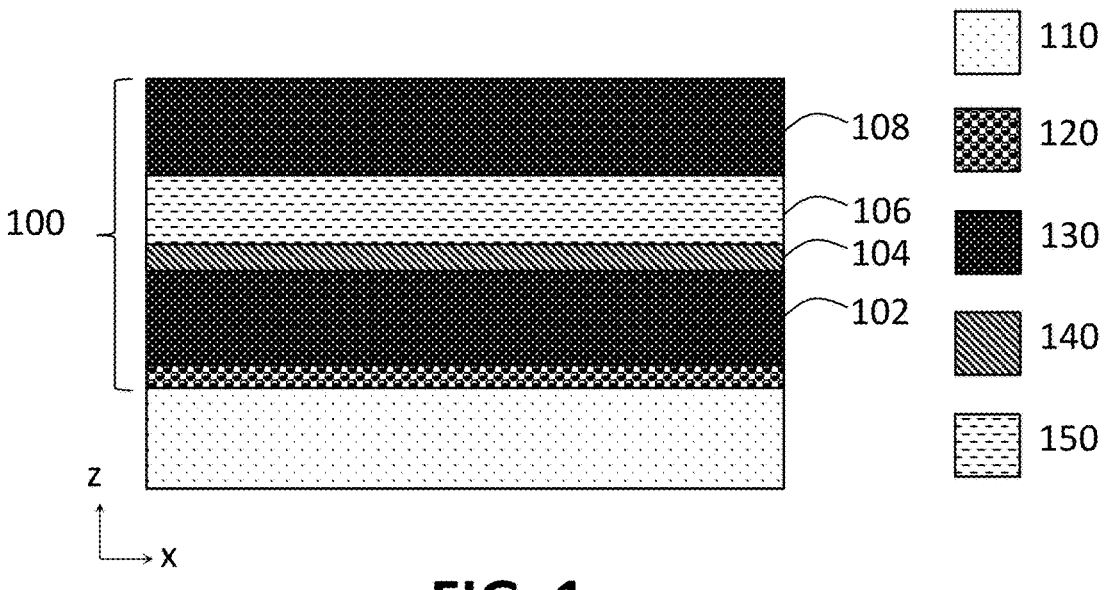
110
120
130
140
150
108
106
104
102
100
z
x
FIG. 1
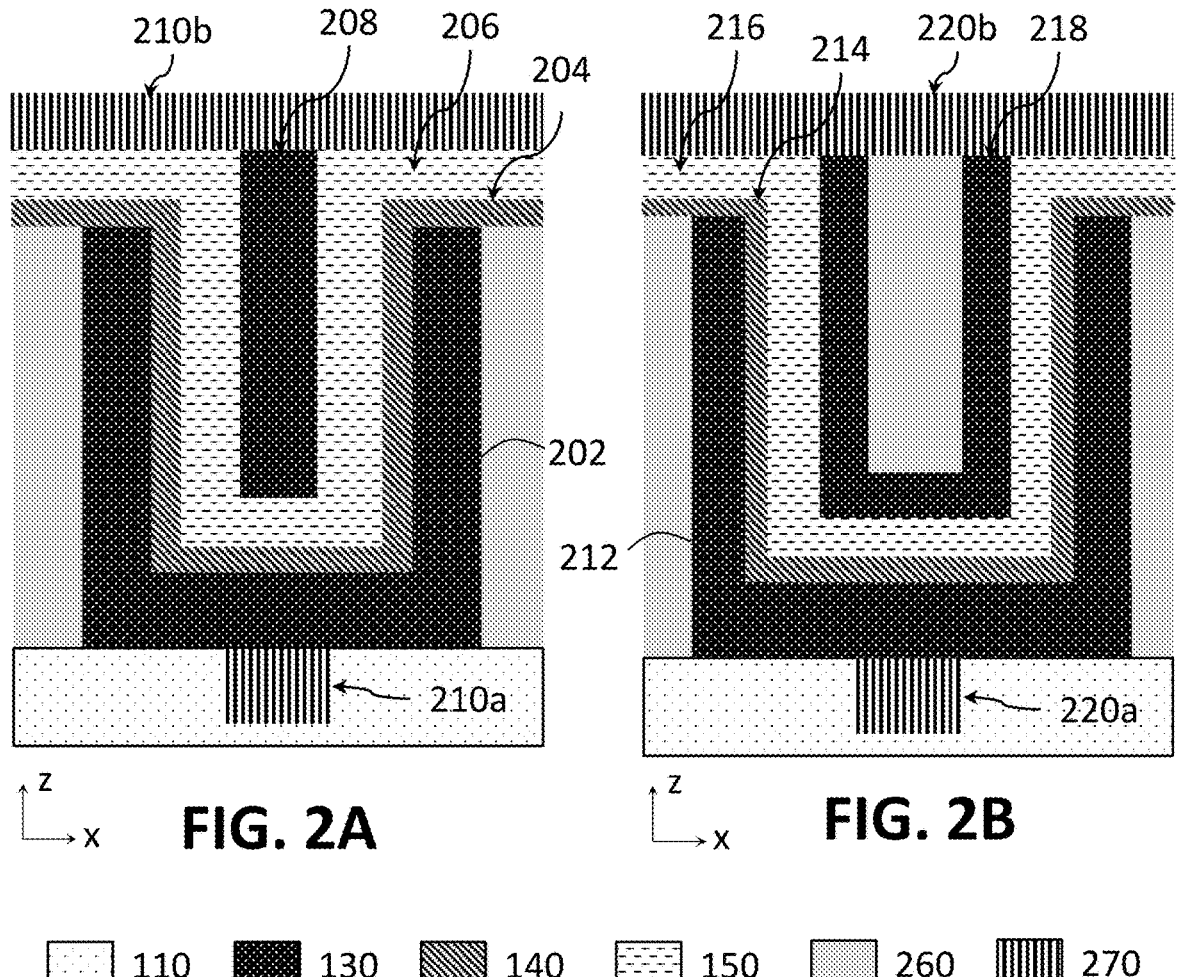
210b 208 206 204
216 214 220b 218
202
212
210a
220a
z
x
FIG. 2A
z
x
FIG. 2B
110 130 140 150 260 270

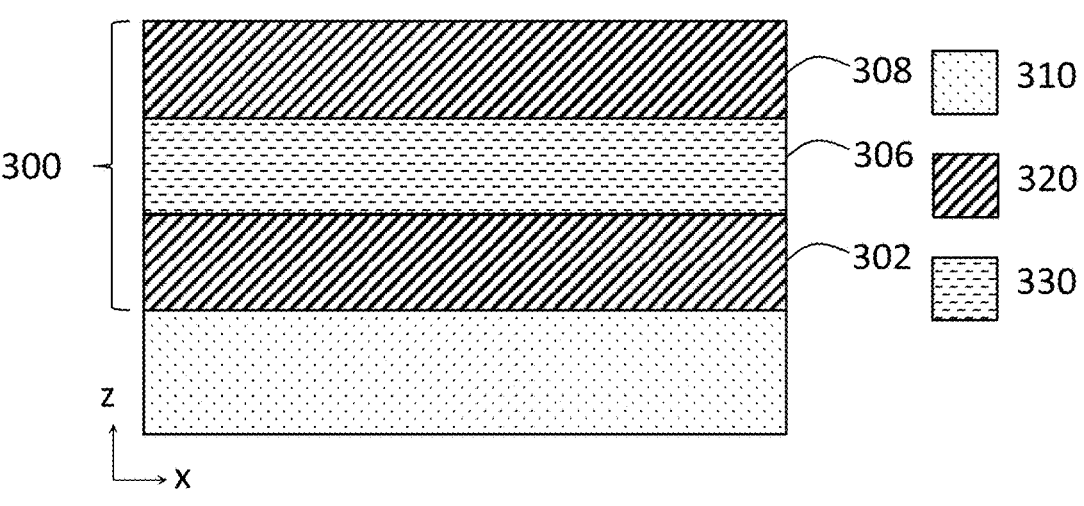
FIG. 3
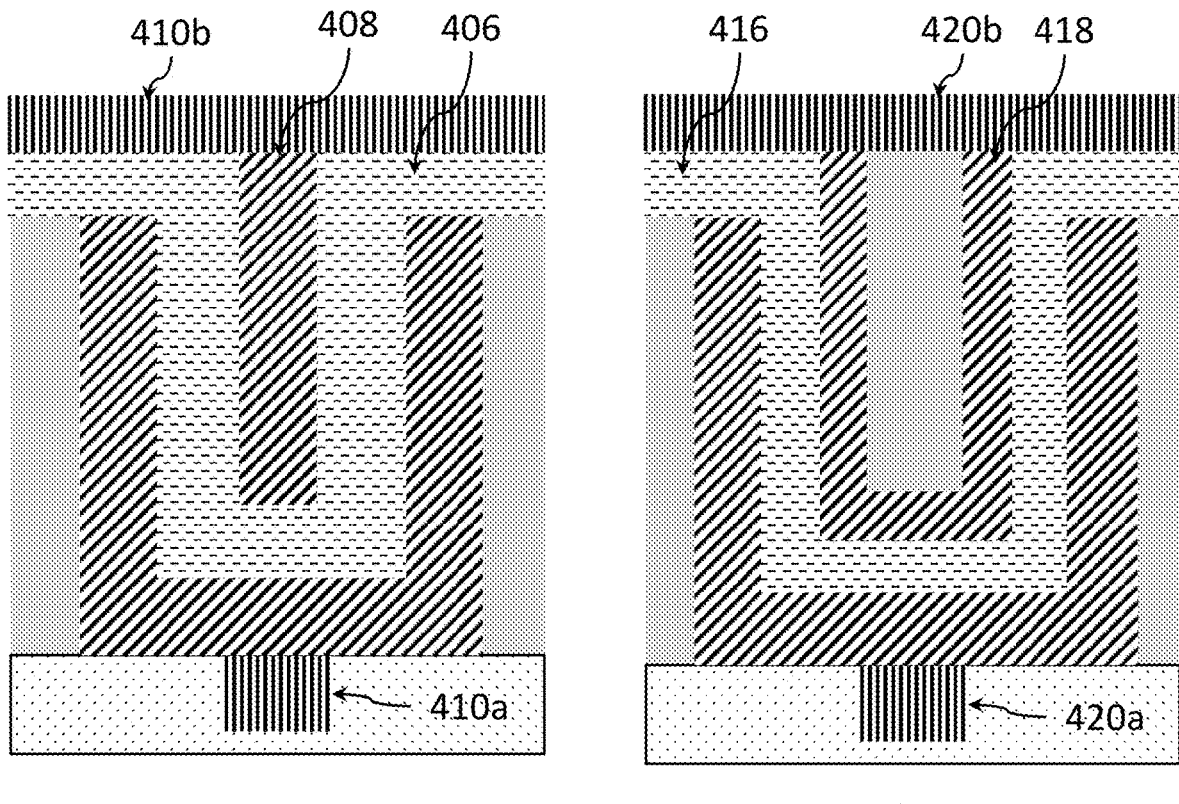
FIG. 4A          FIG. 4B
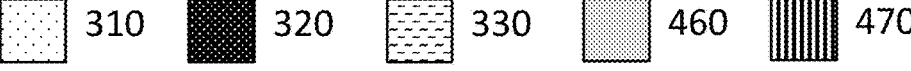

500

600

1500

SEE FIG. 7B

1502

1502

CAPACITOR DEVICES WITH STRONTIUM TITANATE INSULATOR LAYERS

TECHNICAL FIELD

This disclosure relates generally to the field of integrated circuit (IC) structures and devices, and more specifically, to capacitor devices that include a strontium titanate insulator layer.

BACKGROUND

Generally, perovskite materials have a wide variety of applications in the modern electronic industry. Some examples of applications of perovskite materials include usage in capacitors and transistors. Capacitors in integrated circuits can be utilized for creating memory devices or for circuit decoupling. Perovskite materials in conjunction with crystalline electrodes may be utilized for increasing the capacitance and reducing leakage current density in these applications. Therefore, there is a continuing need for improving capacitance density by utilizing materials that enable higher dielectric response while minimizing leakage current.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a cross-sectional view showing an example arrangement of a planar capacitor having a perovskite template layer and a perovskite insulator layer, according to some embodiments of the present disclosure.

FIGS. 2A and 2B illustrate two cross-sectional views showing example arrangements of trench capacitors having a perovskite template layer and a perovskite insulator layer, according to some embodiments of the present disclosure.

FIG. 3 is a cross-sectional view showing an example arrangement of a planar capacitor having an indium tin oxide electrode and a perovskite insulator layer, according to some embodiments of the present disclosure.

FIGS. 4A and 4B illustrate two cross-sectional views showing example arrangements of trench capacitors having an indium tin oxide electrode and a perovskite insulator layer, according to some embodiments of the present disclosure.

DETAILED DESCRIPTION

Overview

Figure 5:
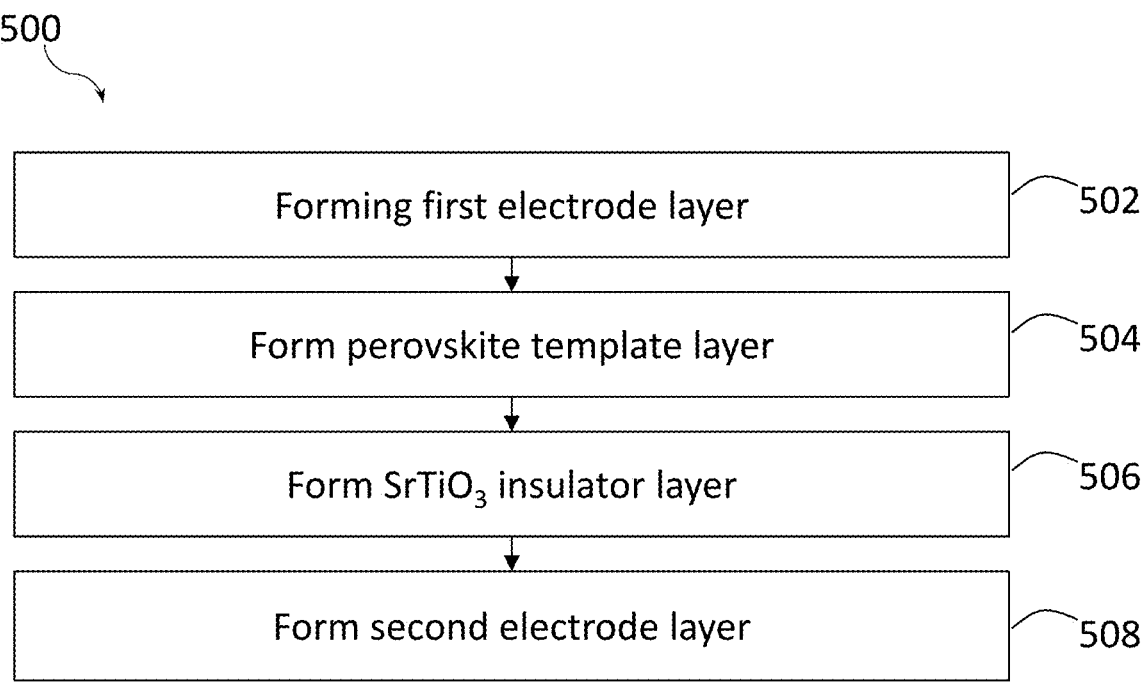
FIG. 5 is a flowchart illustrating a method for forming a capacitor with a perovskite template layer and a perovskite insulator layer, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

A metal-insulator-metal (MIM) capacitor can be utilized in a variety of applications such as for decoupling capacitance in high power microprocessor units, in radio frequency circuits and in other analog integrated circuit devices. A decoupling capacitor, for example, provides a bypass path for transient currents in the circuit. Transient currents can ordinarily damage active electronic devices such as transistors. A decoupling capacitor can also provide power to an integrated circuit and keep the power supply voltage stable. The decoupling capacitor does this by absorbing excess electrical energy (charge) flowing through the circuit. It is desirable for a decoupling capacitor to have a sufficiently large capacitance, such as a capacitance above 8 microfarads/cm$^2$, to control the excess electrical energy and provide a stable power supply voltage. A large capacitance can be obtained when an insulator in a MIM capacitor has a high dielectric constant. A dielectric constant above 20 may be considered to be high. Typical dielectric constants of known dielectric materials such as oxides of hafnium, aluminum, or zirconium are in the range of 25-35. Capacitance of MIM capacitors that utilize one or more traditional dielectric materials can be increased by reducing the thickness of the one or more dielectric materials.

By implementing a material with a dielectric strength that is substantially greater than 50, the capacitance of a MIM capacitor can be increased without reducing the thickness of the dielectric material. Increasing the capacitance enables the MIM capacitor to absorb a greater amount of energy during a transient discharge, for example. Certain perovskite oxides have a high dielectric constant. Perovskite materials generally have a chemical formula $ABX_3$, where A and B are ions, and X is an ion that bonds to both A and B. X is often oxygen (O), forming a perovskite oxide, so the chemical formula may be written $ABO_3$, where A and B are ions that bond to oxygen. An idealized form of the perovskite structure is cubic, and perovskite materials often have a cubic or near-cubic crystal structure.

Some perovskites have a structure and a dielectric permittivity (related to the dielectric constant) that is dependent on temperature of the material. The peak dielectric permittivity may be near a Curie temperature of the material. Materials such as $BaTiO_3$, $SrTiO_3$, and $BaSrTiO_3$ are some examples of perovskites that have dielectric constants that are substantially greater than oxides of metals such as hafnium or zirconium. To fully utilize a high dielectric constant property of such perovskite materials, it is important for the perovskite material to be crystalline and stable at high temperatures.

Though a high dielectric material between two electrodes of a MIM capacitor can increase capacitance, a MIM capacitor may nevertheless degrade due to charge leakage. Charge leakage (or leakage current) can be a limiting factor for a MIM capacitor because charge leakage leads to energy loss.

There are several factors that can affect charge leakage. Poor crystallinity in a perovskite insulator can lead to charge leakage. For example, any nanoscopic variations in the insulator such as presence of pinholes defects can alter the electric field characteristics within a capacitor area and affect the dielectric strength of the insulator.

Described herein are MIM capacitors that include a perovskite insulator between two conductive electrode layers, and methods for producing such devices. For example, ruthenium or iridium may be used to form the electrodes, and strontium titanate ($SrTiO_3$) is a perovskite oxide that may form the insulator layer. Electrode materials such as ruthenium may be lattice matched with a perovskite insulator such as strontium titanate such that the perovskite insulator can be grown with the desired crystal over the electrode. However, irregularities present on the surface quality of the metal electrode (e.g., an undesirable level of surface roughness) may reduce the crystallinity of the perovskite insulator grown over top.

An additional perovskite layer may be included between the bottom electrode and the perovskite insulator. The additional perovskite layer serves as a template layer that can improve the crystallinity of the perovskite insulator (e.g., the $SrTiO_3$ layer) grown over the bottom electrode. Improving the crystallinity of the perovskite insulator reduces charge leakage and improves the performance of the MIM capacitor. For example, the improved crystallinity decreases the EOT (equivalent oxide thickness) of the perovskite insulator.

Also described herein are MIM capacitors that include a perovskite insulator such as $SrTiO_3$ formed between indium tin oxide (ITO) electrodes. Compared to ruthenium or iridium, ITO is less expensive and has wide application in the semiconductor industry. A perovskite insulator layer, such as $SrTiO_3$, can be grown over an ITO electrode with a low EOT (e.g., in the range of 0.7 to 0.8), making the $ITO$-$SrTiO_3$-$ITO$ MIM capacitor suitable for certain applications.

More generally, the MIM capacitors described herein may be implemented in one or more components associated with an IC. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well known features are omitted or simplified in order not to obscure the illustrative implementations.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, as used herein, a "logic state" of a ferroelectric memory cell refers to one of a finite number of states that the cell can have, e.g. logic states "1" and "0," each state represented by a different polarization of the ferroelectric material of the cell. In another example, as used herein, a "READ" and "WRITE" memory access or operations refer to, respectively, determining/sensing a logic state of a memory cell and programming/setting a logic state of a memory cell. In other examples, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. In yet another example, a "high-k dielectric" refers to a material having a higher dielectric constant (k) than silicon oxide. The terms "oxide," "carbide," "nitride," etc. refer to compounds containing, respectively, oxygen, carbon, nitrogen, etc.

Example MIM Capacitors with Perovskite Template Layers and Perovskite Insulator Layers FIG. 1 is a cross-sectional view showing an example arrangement of a planar capacitor having a perovskite template layer and a perovskite insulator layer, according to some embodiments of the present disclosure.

A number of elements referred to in the description of FIGS. 1-4B with reference numerals are illustrated in these figures with different patterns, with a legend showing the correspondence between the reference numerals and patterns being provided at the bottom or side of each drawing page containing FIGS. 1-4B. For example, the legend in FIG. 1 illustrates that FIG. 1 uses different patterns to show a support structure 110, a seed layer 120, an electrode material 130, a templating material 140, and a perovskite insulator material 150.

In the drawings, some example structures of various devices and assemblies described herein are shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

In general, implementations of the present disclosure may be formed or carried out on a support structure 110, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments the support structure 110 may include any such substrate that provides a suitable surface for providing the memory cell shown in FIG. 1.

A planar MIM capacitor 100 is formed over the support structure 110. The planar MIM capacitor 100 includes a first electrode 102 over the support structure 110, a template layer 104, an insulator layer 106, and a second electrode 108. The first electrode 102 may be considered a bottom electrode, and the second electrode 108 may be considered a top electrode. Electrical contacts (not shown in FIG. 1) may be coupled to each of the first electrode 102 and second electrode 108 to apply a voltage across the MIM capacitor 100.

The first electrode 102 and the second electrode 108 are formed of an electrode material 130. In some embodiments, the electrode material 130 is or includes ruthenium. In some embodiments, the electrode material 130 is or includes iridium. While the first electrode 102 and second electrode 108 are depicted as being formed from the same electrode material 130 (e.g., both the first electrode 102 and second electrode 108 are ruthenium), in other embodiments, the first electrode 102 and second electrode 108 may be formed from different materials. The first electrode 102 may have a thickness between, e.g., 2.5 nm and 30 nm. In some embodiments, the first electrode 102 may have a thickness of at least 10 nm, e.g., between 10 nm and 20 nm.

The template layer 104 is formed over the first electrode 102. The template layer 104 is formed from a templating material 140. The templating material 140 is a material with a perovskite structure, e.g., a perovskite oxide having the generic chemical composition $ABO_3$. The template layer 104 serves as a suitable base for depositing additional perovskite thin films over. The template layer 104 may have a thickness between, e.g., 1.5 and 4 nanometers. At such thin thicknesses, the template layer 104 may have a negligible effect on the electrical properties of the MIM capacitor 100.

The templating material 140 may be a perovskite oxide that includes oxygen, strontium, and at least one additional metal. The additional metal may include a material included in the first electrode 102, e.g., the templating material 140 may include ruthenium if the electrode material 130 includes ruthenium, or the templating material 140 may include iridium if the electrode material 130 includes iridium. The templating material may further include a second additional metal selected from, for example, titanium, scandium, rhodium, hafnium, barium, chromium, or iron. The templating material 140 may have a chemical formula $Sr_xB_yO_{3-z}$, where B represents the additional metal (e.g., at least one of titanium, ruthenium, iridium, scandium, rhodium, hafnium, barium, chromium, or iron), x is between 0.1 and 1, y is between 0.1 and 1, and z is between 0 and 2.9. In embodiments that include two additional metals (e.g., ruthenium or iridium, and one of titanium, scandium, rhodium, hafnium, barium, chromium, and iron), the templating material 140 may have a chemical formula $Sr_x(BB')_yO_{3-z}$, where B is the first additional metal, B' is the second additional metal, x is between 0.1 and 1, y is between 0.1 and 1, and z is between 0 and 2.9. As one example, B may be ruthenium, and B' may be titanium. The two additional metals B and B' may be included at any ratio, e.g., 0.1 ruthenium to 0.9 titanium, or 0.9 ruthenium to 0.1 titanium.

In some embodiments, the template layer 104 is grown over the support structure 110 using epitaxial deposition, e.g., pulsed laser deposition or molecular-beam epitaxy. The perovskite insulator layer 106 may be deposited in a similar manner. In other embodiments, the template layer 104 is layer-transferred onto the first electrode 102. For example, the template layer 104 is grown on a separate substrate, the template layer 104 is attached to a carrier wafer, the template layer 104 is bonded to the support structure 110, and the carrier wafer is removed from the template layer 104.

The first electrode 102 and template layer 104 may be collectively referred to as an electrode structure. In some embodiments, such as the illustration shown in FIG. 1, the electrode structure further includes a seed layer 120 formed under the first electrode 102. The seed layer 120 may improve the structure of the electrode material 130 in the first electrode 102. In particular, growing the first electrode 102 over a seed layer 120 may reduce surface roughness of the upper surface of the first electrode 102, which can improve crystallinity of the template layer 104 and the insulator layer 106 formed over the first electrode 102.

The seed layer 120 may include, first example, a crystalline tantalum. In an embodiment, the tantalum seed layer 120 has an amorphous structure. A tantalum seed layer 120 may be advantageously chosen for its high melting point, such as greater than 1500 degrees C. A further advantage includes ease of patterning a seed layer 120 including tantalum compared to other refractory metals, such as titanium or tungsten, that have similar melting points.

The insulator layer 106 is formed over the template layer 104. The insulator layer 106 is formed from a perovskite insulator material 150. For example, the perovskite insulator material 150 may be strontium titanate ($SrTiO_3$). $SrTiO_3$ has a cubic structure with a lattice parameter of 3.905 Å. In other embodiments, different perovskite oxide insulator materials may be used to form the insulator layer 106. For example, in other embodiments, the perovskite insulator material 150 may include barium, e.g., $BaTiO_3$, or $Ba_xSr_{1-x}TiO_3$. The insulator layer 106 may have a thickness of between, e.g., 5 nm and 50 nm.

Forming the insulator layer 106 over the template layer 104, rather than directly over the first electrode 102, improves the crystal structure of the insulator layer 106, decreasing the EOT of the insulator layer 106 and improving performance of the MIM capacitor 100. For example, the material for the template layer 104 may be selected so that the template layer 104 and the insulator layer 106 have perovskite structures with similar lattice parameters, e.g., within 0.5 Å of each other, or within a smaller range of each other (e.g., within 0.3 Å or 0.1 Å). More generally, when a first layer of a first crystalline material is epitaxially deposited over a second layer of a second crystalline material, it is beneficial for the first crystalline material to have a similar structure to the second crystalline material. The similarity of structure helps the first crystalline material form the proper crystal structure when deposited over the second crystalline material. The growing of a first crystalline material over a different, second crystalline material is referred to as heteroepitaxial growth.

The second electrode 108 is formed over the insulator layer 106. The second electrode 108 may be include any metal or metal alloy. As noted above, in some embodiments, the second electrode 108 includes ruthenium or iridium. The second electrode 108 may have a thickness between, e.g., 2.5 nm and 30 nm. In some embodiments, the second electrode 108 may have a thickness of at least 10 nm, e.g., between 10 nm and 20 nm.

FIG. 1 illustrates a planar MIM capacitor 100. Each of the layers 102, 104, 106, and 108 extends in the x-y plane in the coordinate system illustrated in FIG. 1, e.g., each of the layers 102-108 extends parallel to an upper surface of the support structure 110. In other embodiments, a trench MIM capacitor may be formed with a templating layer between the first electrode and the insulator layer. FIGS. 2A and 2B illustrate two cross-sectional views showing example arrangements of trench capacitors having a perovskite template layer and a perovskite insulator layer, according to some embodiments of the present disclosure.

FIG. 2A illustrates a first example arrangement of a trench MIM capacitor that includes a first electrode 202, a template layer 204, an insulator layer 206, and a second electrode 208. The first electrode 202 is formed from the electrode material 130 described above. The template layer 204 is formed from the templating material 140 described above. The insulator layer 206 is formed from the perovskite insulator material 150 described above. The second electrode 208 may be formed from the electrode material 130 (as illustrated in FIG. 2A) or another conducting material (e.g., another metal or metal alloy). A first contact 210a formed in a support structure 110 is coupled to the first electrode 202, and a second contact 210b formed over the trench MIM capacitor is coupled to the second electrode 208. The contacts 210a and 210b are formed from a contact material 270, which may be any metal, metal alloy, or other conductive material. The trench MIM capacitor shown in FIG. 2A is formed within an insulating material 260. For example, the insulating material 260 may be an interlayer dielectric (ILD), e.g., silicon oxide, silicon nitride, aluminum oxide, and/or silicon oxynitride.

FIG. 2B illustrates a second example arrangement of a trench MIM capacitor that includes that includes a first electrode 212, a template layer 214, an insulator layer 216, and a second electrode 218. The first electrode 212 is formed from the electrode material 130 described above. The template layer 214 is formed from the templating material 140 described above. The insulator layer 216 is formed from the perovskite insulator material 150 described above. The second electrode 218 may be formed from the electrode material 130 (as illustrated in FIG. 2A) or another conducting material (e.g., another metal or metal alloy). A first contact 220a formed in a support structure 110 is coupled to the first electrode 212, and a second contact 220b formed over the trench MIM capacitor is coupled to the second electrode 218. The contacts 220a and 220b are formed from a contact material 270, which may be any metal, metal alloy, or other conductive material. The trench MIM capacitor shown in FIG. 2A is formed within the insulating material 260.

In FIG. 2A, the second electrode 208 fills the space between the two sides of the insulator layer 206 (i.e., the two portions of the insulator layer 206 extending in the z-direction in the coordinate system shown in FIG. 2). By contrast, in FIG. 2B, the second electrode 218 includes a base extending in the x-y plane and two sides extending in the y-z plane. An insulating material, e.g., the insulating material 260 (as illustrated in FIG. 2B), fills the space between the two sides of the second electrode 218.

A trench capacitor, such as the trench MIM capacitors shown in FIGS. 2A and 2B, may be fabricated by etching (for example, by photolithography) a deep, narrow opening, referred to as a trench, in a layer of insulating material (e.g., in a layer of an insulator 260). The opening is lined with a conductor (such as the first electrode 202 or 212), an insulator (such as the insulator material 150), and another conductor (such as the second electrode 208 or 218). In the embodiments illustrated in FIGS. 2A and 2B, a template layer 204 or 214 formed of the templating material 140 lines the first electrode 202 or 212, which improves the crystal structure of the insulator material 150 deposited over the templating material 140, as described with respect to FIG. 1. The insulator material 150 insulates the first electrode 202 or 212 from the second electrode 208 or 218, thus forming a capacitor.

In some embodiments, a trench MIM capacitor may be fabricated in a metal layer, using a separate process from the rest of the metal layer fabrication, e.g., to account for its large height and possibly different electrode material from the rest of the metal layer. The trench structure advantageously creates a relatively large capacitance in the MIM capacitor by having a relatively large surface area for the terminals (e.g., the top and bottom electrodes) separated by a relatively small amount of insulation (e.g., the insulator material 150). The layers of a trench MIM capacitor may be deposited using a conformal deposition method, such as atomic level deposition (ALD) or chemical vapor deposition (CVD). While not shown in FIG. 2A or 2B, a seed layer similar to the seed layer 120 described with respect to FIG. 1 may line the trench opening, and the first electrode 202 or 212 may be formed over the seed layer. The thicknesses of the first electrode 202 or 212, template layer 204 or 214, insulator layer 206 or 216, and second electrode 208 or 218 may be similar to the thicknesses of the first electrode 102, template layer 104, insulator layer 106, and second electrode 108, respectively, described with respect to FIG. 1. A trench MIM capacitor can be e.g., between 50 nanometers and 500 nanometers tall (in the z-direction) in some embodiments, to provide sufficient capacitance.

Example MIM Capacitors with ITO Electrodes and Perovskite Insulator Layers

FIG. 3 is a cross-sectional view showing an example arrangement of a planar capacitor having an indium tin oxide electrode and a perovskite insulator layer, according to some embodiments of the present disclosure.

A planar capacitor 300 is formed over a support structure 310, which may be similar to the support structure 110 described with respect to FIG. 1. The planar capacitor 300 includes a first electrode 302 over the support structure 310, an insulator layer 306, and a second electrode 308. The first electrode 302 may be considered a bottom electrode, and the second electrode 308 may be considered a top electrode. Electrical contacts (not shown in FIG. 3) may be coupled to each of the first electrode 302 and second electrode 308 to apply a voltage across the planar capacitor 300.

The first electrode 302 and the second electrode 308 are formed of an electrode material 320. In this example, the electrode material 320 includes indium, tin, and oxygen. For example, the electrode material 320 is indium tin oxide, or ITO. ITO is a conducting oxide that can be deposited as a thin film. ITO may be deposited as a thin film using physical vapor deposition, e.g., using electron beam deposition or sputter deposition. Different formulations of ITO have different proportions of indium, tin, and oxide. For example, an oxygen-saturated composition of ITO may have 74% indium (In), 18% tin (Sn), and 8% oxygen (O) by weight.

While the first electrode 302 and second electrode 308 are depicted as being formed from the same electrode material 320 (e.g., both the first electrode 302 and second electrode 308 are ITO), in other embodiments, the first electrode 302 and second electrode 308 may be formed from different materials, e.g., the first electrode 302 may be ITO and the second electrode 308 a metal or metal alloy. As another example, the first electrode 302 may be ruthenium, indium, or titanium nitride (TiN), and the second electrode 308 may be ITO. In some embodiments, a template layer similar to the template layer 104 is formed over the first electrode 302, as described with respect to FIG. 1. For example, a capacitor may include a first electrode 302 formed from ruthenium or iridium, the template layer 104 described with respect to FIG. 1, and a second electrode 308 formed from ITO. The first electrode 302 may have a thickness between, e.g., 2.5 nm and 30 nm. In some embodiments, the first electrode 302 may have a thickness of at least 10 nm, e.g., between 10 nm and 20 nm.

The insulator layer 306 is formed over the first electrode 302. The insulator layer 306 is formed from a perovskite insulator material 330. For example, the perovskite insulator material 330 may be strontium titanate ($SrTiO_3$). In other embodiments, different perovskite oxide insulator materials may be used to form the insulator layer 306. For example, in other embodiments, the perovskite insulator material 330 may include barium, e.g., $BaTiO_3$, or $Ba_xSr_{1-x}TiO_3$. The insulator layer 306 may have a thickness of between, e.g., 5 nm and 50 nm. The insulator layer 306 may be epitaxially deposited over the first electrode 302, or the insulator layer 306 may be layer-transferred onto the first electrode 302.

The second electrode 308 is formed over the insulator layer 306. In some embodiments, the second electrode 308 is ITO. In other embodiments, the second electrode 308 may be include any metal, metal alloy, or other conducting material. The second electrode 308 may have a thickness between, e.g., 2.5 nm and 30 nm. In some embodiments, the second electrode 308 may have a thickness of at least 10 nm, e.g., between 10 nm and 20 nm.

The capacitor 300 may have an EOT between about 0.75 and 0.85. The dielectric constant of the insulator layer 306 in the capacitor 300 may be, e.g., between 60 and 70, e.g., around 65. This improves upon existing MIM capacitors, e.g., the capacitor 300 has a higher dielectric constant than an aluminum hafnium oxide-hafnium zinc oxide MIM capacitor.

FIG. 3 illustrates a planar capacitor 300. Each of the layers 302, 306, and 308 extends in the x-y plane in the coordinate system illustrated in FIG. 3, e.g., each of the layers 302, 306, and 308 extends parallel to an upper surface of the support structure 310. In other embodiments, a trench capacitor may be formed with ITO electrodes and a perovskite insulator layer. FIGS. 4A and 4B illustrate two cross-sectional views showing example arrangements of trench capacitors having ITO electrodes and a perovskite insulator layer, according to some embodiments of the present disclosure.

FIG. 4A illustrates a first example arrangement of a trench capacitor that includes a first electrode 402, an insulator layer 406, and a second electrode 408. The first electrode 402 is formed from the electrode material 320 described above, e.g., ITO. The insulator layer 406 is formed from the perovskite insulator material 330 described above, e.g., $SrTiO_3$. The second electrode 408 may be formed from the electrode material 320 (as illustrated in FIG. 4A), e.g., ITO, or another conducting material. A first contact 410a formed in a support structure 310 is coupled to the first electrode 402, and a second contact 410b formed over the trench capacitor is coupled to the second electrode 408. The contacts 410a and 410b are formed from a contact material 470, which may be any metal, metal alloy, or other conductive material. The trench capacitor shown in FIG. 4A is formed within an insulating material 460. For example, the insulating material 460 may be an ILD, e.g., silicon oxide, silicon nitride, aluminum oxide, and/or silicon oxynitride.

FIG. 4B illustrates a second example arrangement of a trench capacitor that includes that includes a first electrode 412, an insulator layer 416, and a second electrode 418. The first electrode 412 is formed from the electrode material 320 described above, e.g., ITO. The insulator layer 416 is formed from the perovskite insulator material 330 described above, e.g., $SrTiO_3$. The second electrode 418 may be formed from the electrode material 320 (as illustrated in FIG. 4B), e.g., ITO, or another conducting material. A first contact 420a formed in a support structure 310 is coupled to the first electrode 412, and a second contact 420b formed over the trench capacitor is coupled to the second electrode 418. The contacts 420a and 420b are formed from the contact material 470. The trench capacitor shown in FIG. 4A is formed within the insulating material 460.

In FIG. 4A, the second electrode 408 fills the space between the two sides of the insulator layer 406 (i.e., the two portions of the insulator layer 406 extending in the z-direction in the coordinate system shown in FIG. 4). By contrast, in FIG. 4B, the second electrode 418 includes a base extending in the x-y plane and two sides extending in the y-z plane. An insulating material, e.g., the insulating material 460 (as illustrated in FIG. 4B), fills the space between the two sides of the second electrode 418.

As described with respect to FIGS. 2A and 2B, a trench capacitor, such as the trench capacitors shown in FIGS. 4A and 4B, may be fabricated by etching (for example, by photolithography) a deep, narrow opening, referred to as a trench, in a layer of insulating material (e.g., in a layer of an insulator 460). The opening is lined with a conductor (such as the first electrode 402 or 412), an insulator (such as the insulator material 330), and another conductor (such as the second electrode 408 or 418). The insulator material 330 insulates the first electrode 402 or 412 from the second electrode 408 or 418, thus forming a capacitor.

In some embodiments, a trench capacitor may be fabricated in a metal layer, using a separate process from the rest of the metal layer fabrication, e.g., to account for its large height and possibly different electrode material from the rest of the metal layer. The trench structure advantageously creates a relatively large capacitance in the capacitor by having a relatively large surface area for the terminals (e.g., the top and bottom electrodes) separated by a relatively small amount of insulation (e.g., the insulator material 330). The layers of a trench capacitor may be deposited using a conformal deposition method, such as ALD or CVD. The thicknesses of the first electrode 402 or 412, insulator layer 406 or 416, and second electrode 408 or 418 may be similar to the thicknesses of the first electrode 302, insulator layer 306, and second electrode 308, respectively, described with respect to FIG. 3. A trench capacitor can be e.g., between 50 nanometers and 500 nanometers tall (in the z-direction) in some embodiments, to provide sufficient capacitance.

Example Methods for Forming Capacitors with Perovskite Insulator Layers

FIG. 5 is a flowchart illustrating a method for forming a capacitor with a perovskite template layer and a perovskite insulator layer, according to some embodiments of the present disclosure.

The method begins with forming 502 a first electrode layer, e.g., the first electrode 102 shown in FIG. 1, the first electrode 202 shown in FIG. 2A, or the first electrode 212 shown in FIG. 2B. To form a planar capacitor, the first electrode may be deposited over a support structure, e.g., the support structure 110. Alternatively, to form a trench capacitor, the first electrode may be deposited in a trench opening formed in a layer of ILD, e.g., as shown in FIGS. 2A and 2B.

The method proceeds with forming 504 a perovskite template layer over the first electrode layer. The perovskite template layer may be, e.g., the template layer 104 shown in FIG. 1, the template layer 204 shown in FIG. 2A, or the template layer 214 shown in FIG. 2B. A templating material 140 forming the template layer may be epitaxially deposited over the first electrode layer, as described with respect to FIG. 1. In other embodiments, e.g., when forming a planar capacitor, the templating material 140 may be layer-transferred over the first electrode.

The method proceeds with forming 506 a SrTiO₃ insulator layer over the template layer. The insulator layer may be the insulator layer 106 shown in FIG. 1, the insulator layer 206 shown in FIG. 2A, or the insulator layer 216 shown in FIG. 2B. The SrTiO₃ insulator layer may be epitaxially deposited over the template layer, and may have a perovskite crystal structure similar to the template layer.

The method proceeds with forming 508 a second electrode layer over the insulator layer. The second electrode layer may be, e.g., the second electrode 108 shown in FIG.

1, the second electrode 208 shown in FIG. 2A, or the second electrode 218 shown in FIG. 2B.

Figure 6:
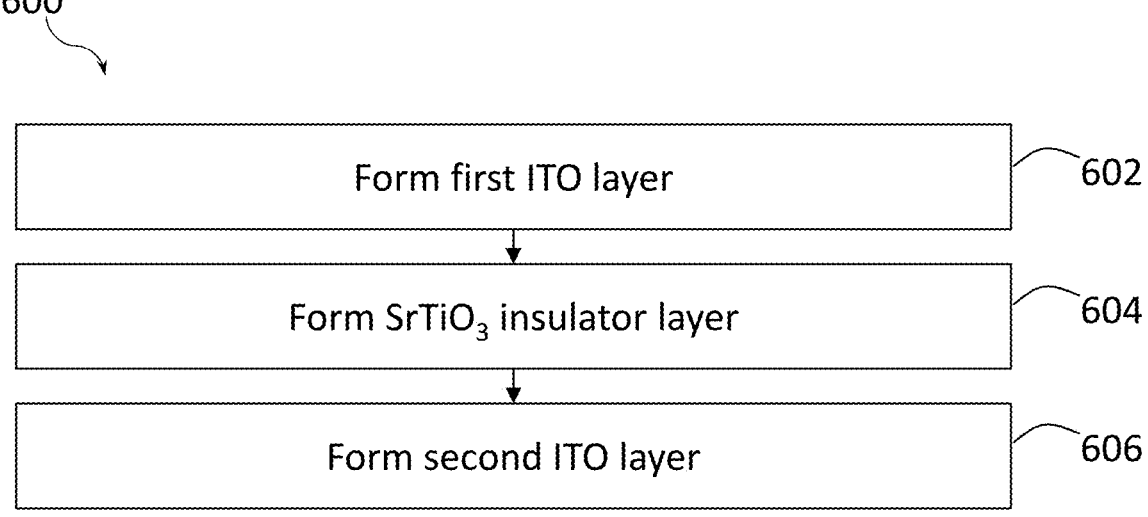
FIG. 6 is a flowchart illustrating a method for forming a capacitor with an indium tin oxide electrode and a perovskite insulator layer, according to some embodiments of the present disclosure.

FIG. 6 is a flowchart illustrating a method for forming a capacitor with an indium tin oxide electrode and a perovskite insulator layer, according to some embodiments of the present disclosure.

The method begins with forming 602 a first ITO layer, e.g., the first electrode 302 shown in FIG. 3, the first electrode 402 shown in FIG. 4A, or the first electrode 412 shown in FIG. 4B. To form a planar capacitor, the first ITO layer may be deposited over a support structure, e.g., the support structure 310. Alternatively, to form a trench capacitor, the first ITO layer may be deposited in a trench opening formed in a layer of ILD, e.g., as shown in FIGS. 4A and 4B.

The method proceeds with forming 604 a SrTiO₃ insulator layer over the first ITO layer. The insulator layer may be the insulator layer 306 shown in FIG. 3, the insulator layer 406 shown in FIG. 4A, or the insulator layer 416 shown in FIG. 4B.

The SrTiO₃ material forming the SrTiO₃ insulator layer may be epitaxially deposited over the first ITO layer. In other embodiments, e.g., when forming a planar capacitor, the SrTiO₃ material may be layer-transferred over the first ITO layer.

The method proceeds with forming 606 a second electrode layer over the SrTiO₃ insulator layer. The second electrode layer may be, e.g., the second electrode 308 shown in FIG. 3, the second electrode 408 shown in FIG. 4A, or the second electrode 418 shown in FIG. 4B.

Example Devices

Any of the capacitors having a perovskite insulator disclosed herein may be included in any suitable electronic device. FIGS. 7-10 illustrate various examples of apparatuses that may include a capacitor having a perovskite insulator as disclosed herein.

Figure 7A:
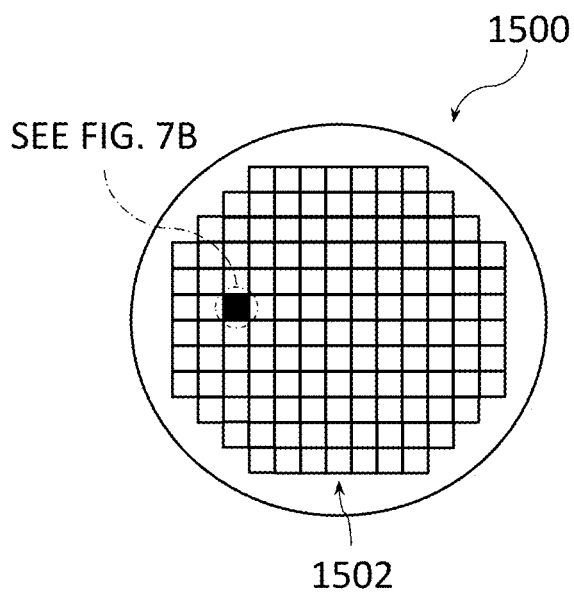
FIGS. 7A and 7B are top views of a wafer and dies that include a capacitor having a perovskite insulator in accordance with any of the embodiments disclosed herein.
Figure 7B:
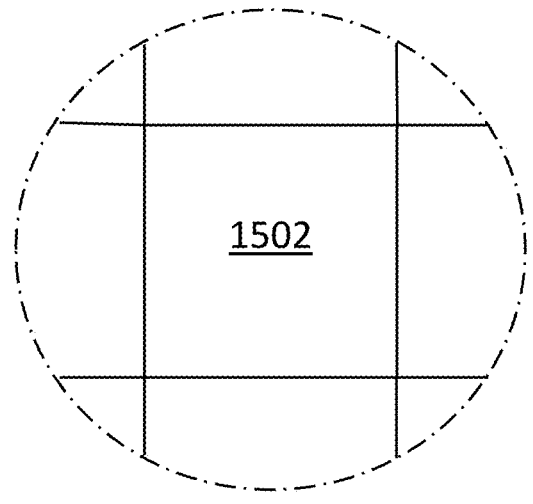

FIGS. 7A and 7B are top views of a wafer and dies that include one or more IC structures with devices including a capacitor having a perovskite insulator in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIGS. 1-4, or any further embodiments of the IC structures described herein). After the fabrication of the semiconductor product is complete (e.g., after manufacture of one or more IC structures with one or more capacitors having a perovskite insulator as described herein, included in a particular electronic component, e.g., in a memory device), the wafer 1500 may undergo a singulation process in which each of the dies 1502 is separated from one another to provide discrete "chips" of the semiconductor product. In particular, devices that include one or more capacitors having a perovskite insulator as disclosed herein may take the form of the wafer 1500 (e.g., not singulated) or the form of the die 1502 (e.g., singulated). The die 1502 may include one or more transistors (e.g., one or more of the transistors 1640 of FIG. 8, discussed below) and/or supporting circuitry to route electrical signals to the transistors, as well as any other IC components (e.g., one or more capacitors having a perovskite insulator). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 8:
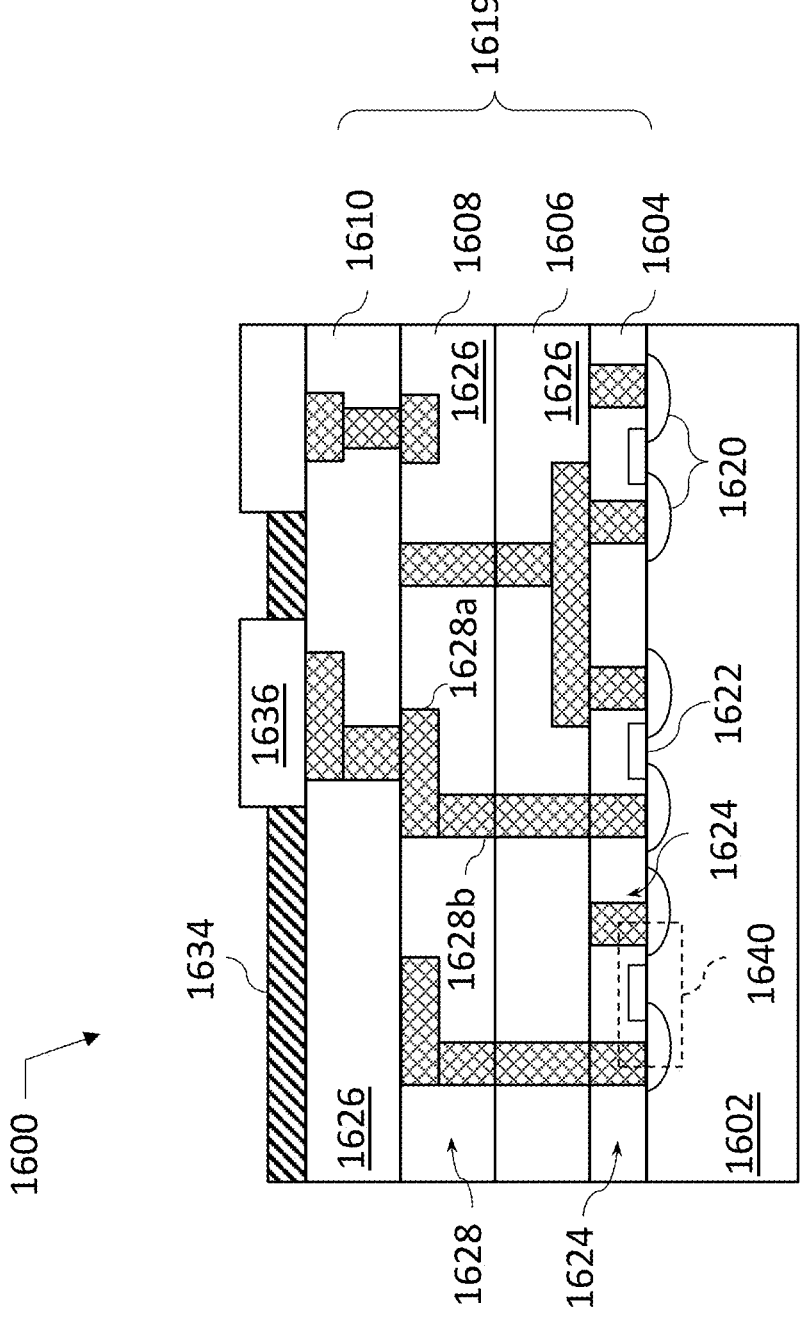
FIG. 8 is a cross-sectional side view of an IC device that may include a capacitor having a perovskite insulator in accordance with any of the embodiments disclosed herein.

FIG. 8 is a cross-sectional side view of an IC device 1600 that may include one or more capacitors having a perovskite insulator in accordance with any of the embodiments disclosed herein. The IC device 1600 may be formed on a substrate 1602 (e.g., the wafer 1500 of FIG. 7A) and may be included in a die (e.g., the die 1502 of FIG. 7B). The substrate 1602 may be any substrate as described herein. The substrate 1602 may be part of a singulated die (e.g., the dies 1502 of FIG. 7B) or a wafer (e.g., the wafer 1500 of FIG. 7A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 8 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The IC device 1600 may include one or more capacitors having a perovskite insulator at any suitable location in the IC device 1600.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 8 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 8). Although a particular number of interconnect layers 1606-1610 is depicted in FIG. 8, embodiments of the present disclosure include IC devices having more or fewer interconnect layers than depicted.

In some embodiments, the interconnect structures 1628 may include trench contact structures 1628a (sometimes referred to as "lines") and/or via structures 1628b (sometimes referred to as "holes") filled with an electrically conductive material such as a metal. The trench contact structures 1628a may be arranged to route electrical signals in a direction of a plane that is substantially parallel with a surface of the substrate 1602 upon which the device layer 1604 is formed. For example, the trench contact structures 1628a may route electrical signals in a direction in and out of the page from the perspective of FIG. 8. The via structures 1628b may be arranged to route electrical signals in a direction of a plane that is substantially perpendicular to the surface of the substrate 1602 upon which the device layer 1604 is formed. In some embodiments, the via structures 1628b may electrically couple trench contact structures 1628a of different interconnect layers 1606-1610 together.

The interconnect layers 1606-1610 may include a dielectric material 1626 disposed between the interconnect structures 1628, as shown in FIG. 8. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628a and/or via structures 1628b, as shown. The trench contact structures 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628b to couple the trench contact structures 1628a of the second interconnect layer 1608 with the trench contact structures 1628a of the first interconnect layer 1606. Although the trench contact structures 1628a and the via structures 1628b are structurally delineated with a line within each interconnect layer (e.g., within the second interconnect layer 1608) for the sake of clarity, the trench contact structures 1628a and the via structures 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 9:
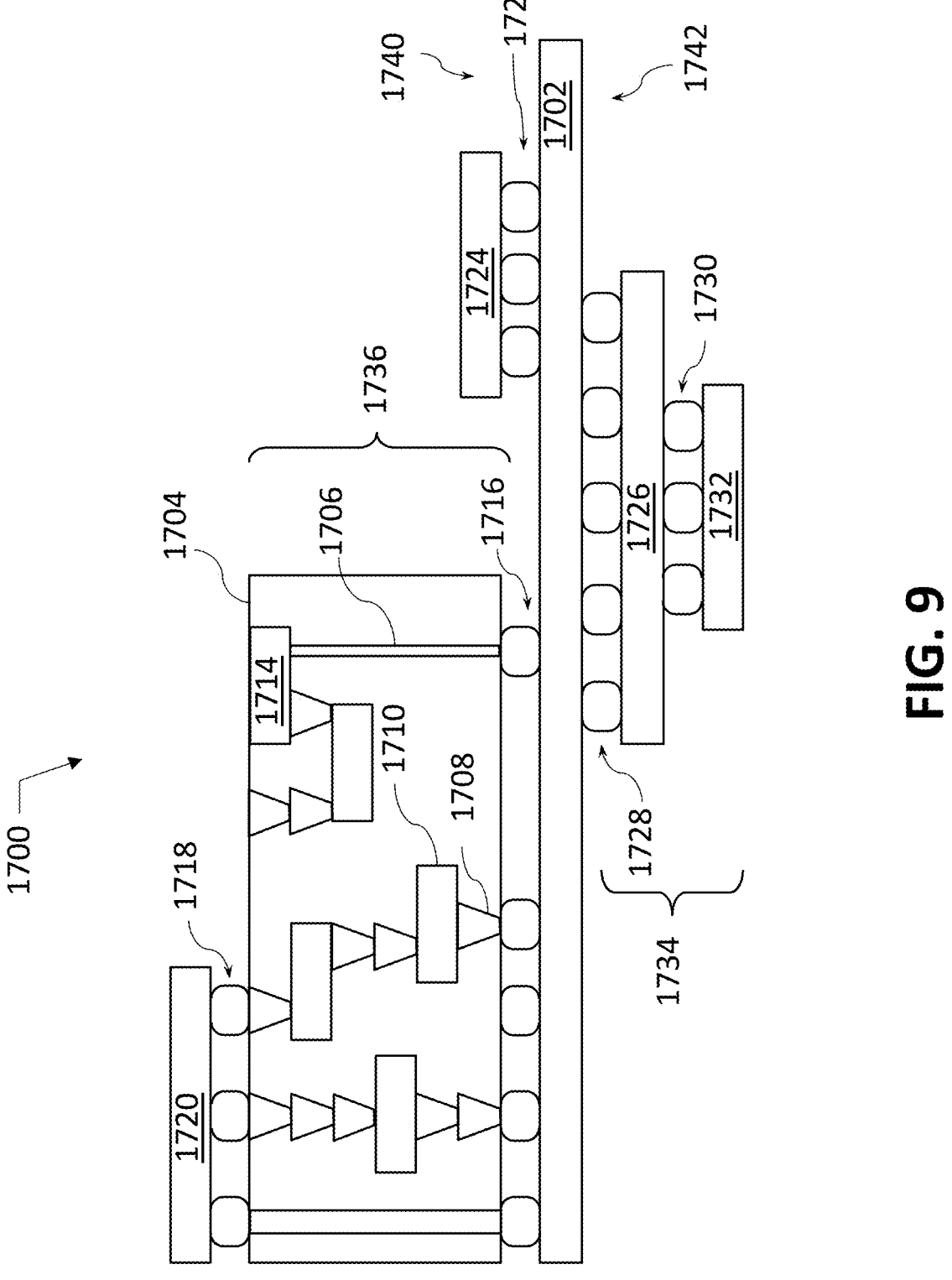
FIG. 9 is a cross-sectional side view of an IC device assembly that may include a capacitor having a perovskite insulator in accordance with any of the embodiments disclosed herein.

FIG. 9 is a cross-sectional side view of an IC device assembly 1700 that may include components having or being associated with (e.g., being electrically connected by means of) one or more capacitors having a perovskite insulator in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the capacitors having a perovskite insulator disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 7B), an IC device (e.g., the IC device 1600 of FIG. 8), or any other suitable component. In some embodiments, the IC package 1720 may include capacitors having a perovskite insulator, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 9, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectro-mechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
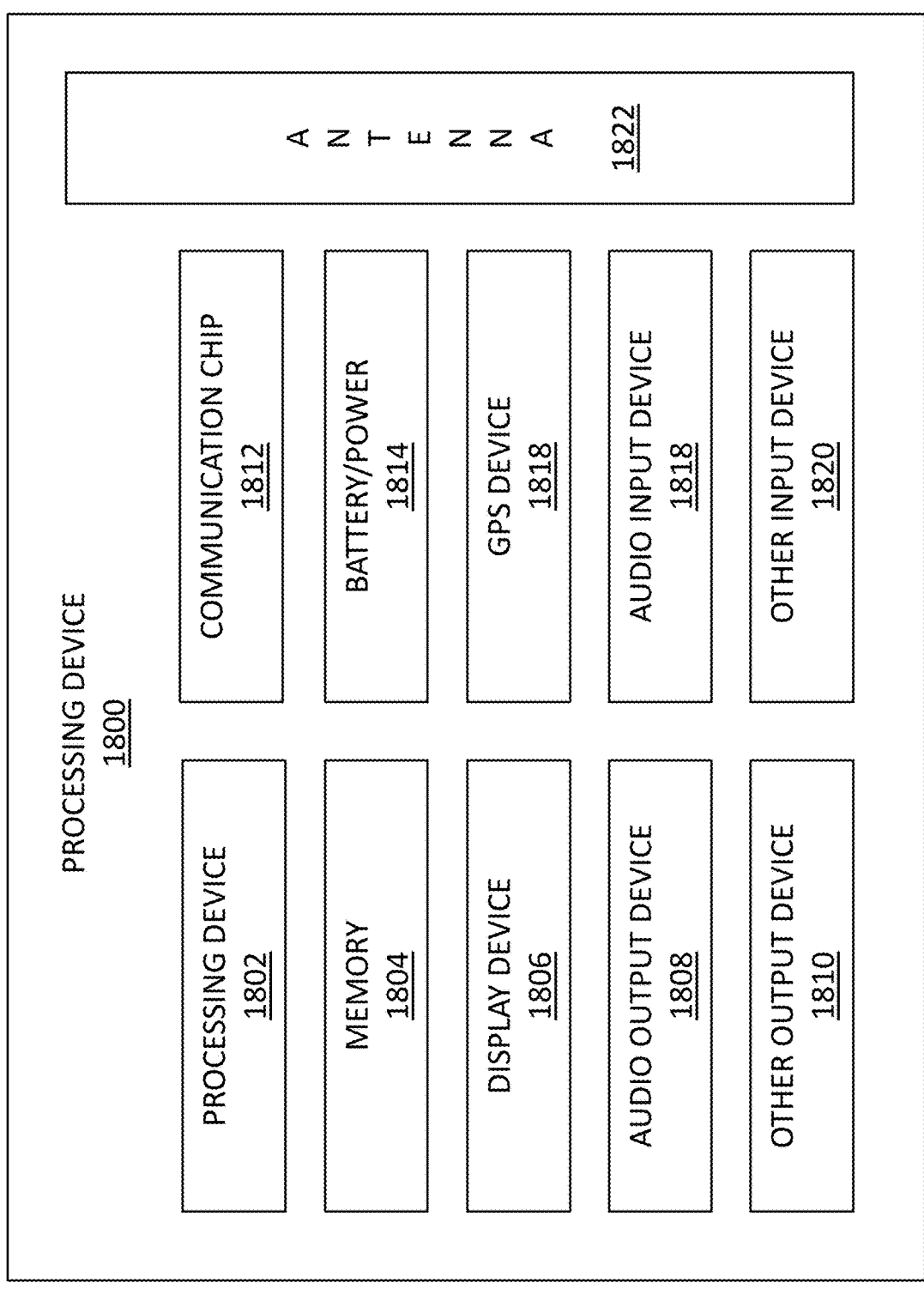
FIG. 10 is a block diagram of an example computing device that may include a capacitor having a perovskite insulator in accordance with any of the embodiments disclosed herein.

FIG. 10 is a block diagram of an example computing device 1800 that may include one or more components including one or more capacitors having a perovskite insulator in accordance with any of the embodiments disclosed herein. For example, any suitable ones of the components of the computing device 1800 may include a die (e.g., the die 1502 of FIG. 7B) having capacitors having a perovskite insulator as described herein. Any one or more of the components of the computing device 1800 may include, or be included in, an IC device 1600 (FIG. 8). Any one or more of the components of the computing device 1800 may include, or be included in, an IC device assembly 1700 (FIG. 9).

A number of components are illustrated in FIG. 10 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 10, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

Select Examples

The following paragraphs provide various examples of the embodiments disclosed herein.

Example 1 provides a device that has a first layer including ruthenium or iridium; a second layer over the first layer, the second layer including oxygen, strontium, and at least one additional metal; a third layer over the second layer, the third layer including oxygen, strontium, and titanium; and a fourth layer over the third layer, the fourth layer including a metal.

Example 2 provides the device of example 1, where the second layer includes a perovskite oxide.

Example 3 provides the device of example 1 or 2, where the first layer includes ruthenium, and the at least one additional metal includes ruthenium.

Example 4 provides the device of example 1 or 2, where the first layer includes iridium, and the at least one additional metal includes iridium.

Example 5 provides the device of example 3 or 4, where the at least one additional metal in the second layer further includes titanium.

Example 6 provides the device of example 3 or 4, where the at least one additional metal in the second layer further includes scandium.

Example 7 provides the device of example 3 or 4, where the at least one additional metal in the second layer further includes rhodium.

Example 8 provides the device of example 3 or 4, where the at least one additional metal in the second layer further includes hafnium.

Example 9 provides the device of example 3 or 4, where the at least one additional metal in the second layer further includes barium.

Example 10 provides the device of example 3 or 4, where the at least one additional metal in the second layer further includes chromium.

Example 11 provides the device of example 3 or 4, where the at least one additional metal in the second layer further includes iron.

Example 12 provides the device of any of the preceding examples, where a material in the second layer has a formula $Sr_xB_yO_{3-z}$, B includes the additional metal, x is between 0.1 and 1, y is between 0.1 and 1, and z is between 0 and 2.9.

Example 13 provides the device of any of the preceding examples, where the fourth layer includes ruthenium or iridium.

Example 14 provides the device of any of the preceding examples, where the second layer has a thickness between 1.5 and 4 nanometers.

Example 15 provides the device of example 14, where the third layer has a thickness between 5 and 50 nanometers.

Example 16 provides a memory device including a plurality of MIM capacitors, one of the MIM capacitors including a metal layer including ruthenium or iridium; a first insulator layer over the metal layer, the first insulator layer including oxygen, strontium, and at least one additional metal; and a second insulator layer over the first insulator layer, the second insulator layer including oxygen, strontium, and titanium.

Example 17 provides the memory device of example 16, the capacitor further including a second metal layer over the second insulator layer, the second metal layer including ruthenium or iridium.

Example 18 provides the memory device of example 16 or 17, where the first insulator layer includes a perovskite oxide.

Example 19 provides the memory device of example 16 or 17, where the additional metal in the first insulator layer is titanium.

Example 20 provides the memory device of example 16 or 17, where the additional metal in the first insulator layer is ruthenium or Ir.

Example 21 provides the memory device of example 16 or 17, where the additional metal in the first insulator layer is scandium.

Example 22 provides the memory device of example 16 or 17, where the additional metal in the first insulator layer is rhodium.

Example 23 provides the memory device of example 16 or 17, where the additional metal in the first insulator layer is hafnium.

Example 24 provides the memory device of example 16 or 17, where the additional metal in the first insulator layer is barium.

Example 25 provides the memory device of example 16 or 17, where the additional metal in the first insulator layer is chromium.

Example 26 provides the memory device of example 16 or 17, where the additional metal in the first insulator layer is iron.

Example 27 provides the memory device of any of examples 16 through 26, where a material in the first insulator layer has a formula $Sr_xB_yO_{3-z}$, B includes the additional metal, x is between 0.1 and 1, y is between 0.1 and 1, and z is between 0 and 2.9.

Example 28 provides the memory device of any of examples 16 through 26, where the additional metal is a first additional metal, the second layer further including a second additional metal.

Example 29 provides the memory device of example 28, where a material in the first insulator layer has a formula $Sr_x(BB')_yO_{3-z}$, B is the first additional metal, B' is the second additional metal, x is between 0.1 and 1, y is between 0.1 and 1, and z is between 0 and 2.9.

Example 30 provides the device of any of examples 16 through 29, where the first insulator layer has a thickness between 1.5 and 4 nanometers.

Example 31 provides the device of example 30, where the second insulator layer has a thickness between 5 and 50 nanometers.

Example 32 provides a device having a first layer including indium, tin, and oxygen; a second layer over the first layer, the second layer including oxygen, strontium, and titanium; and a third layer over the second layer, the third layer including indium, tin, and oxygen.

Example 33 provides the device of example 32, where the first layer, second layer, and third layer form a MIM capacitor.

Example 34 provides the device of example 33, where the first layer, second layer, and third layer extend over a support structure, and the MIM capacitor is a planar capacitor.

Example 35 provides the device of example 33, where at least a portion of the first layer, a portion of the second layer, and a portion of the third layer extend in a direction substantially perpendicular to a support structure, and the MIM capacitor is a trench capacitor.

Example 36 provides the device of any of examples 32 through 35, where the second layer has a thickness between 5 and 50 nanometers.

Example 37 provides the device of any of examples 32 through 36, where the first layer has a thickness between 2.5 and 30 nanometers.

Example 38 provides the device of example 37, where the third layer has a thickness between 2.5 and 30 nanometers.

Example 39 provides the device of any of examples 32 through 38, where the device has an EOT between 0.75 and 0.85.

Example 40 provides a memory device having a plurality of MIM capacitors, one of the MIM capacitors including a first conducting layer including indium, tin, and oxygen; an insulating layer over the first layer, the insulating layer including oxygen, strontium, and titanium; and a second conducting layer over the insulating layer, the second conducting layer including indium, tin, and oxygen.

Example 41 provides the memory device of example 40, where a second one of the MIM capacitors includes a first layer including indium, tin, and oxygen; a second layer over the first layer, the second layer including oxygen, strontium, and titanium; and a third layer over the second layer, the third layer including indium, tin, and oxygen.

Example 42 provides the device of example 40 or 41, where the second layer has a thickness between 5 and 50 nanometers.

Example 43 provides the device of any of examples 40 through 42, where the first layer has a thickness between 2.5 and 30 nanometers.

Example 44 provides the device of example 43, where the third layer has a thickness between 2.5 and 30 nanometers.

Example 45 provides the device of any of examples 40 through 44, where the device has an EOT between 0.75 and 0.85.

Example 46 provides an IC package that includes an IC die, including one or more of the IC devices according to any one of the preceding examples. The IC package may also include a further component, coupled to the IC die.

Example 47 provides the IC package according to example 46, where the further component is one of a package substrate, a flexible substrate, or an interposer.

Example 48 provides the IC package according to examples 46 or 47, where the further component is coupled to the IC die via one or more first level interconnects.

Example 49 provides the IC package according to example 48, where the one or more first level interconnects include one or more solder bumps, solder posts, or bond wires.

Example 50 provides a computing device that includes a circuit board; and an IC die coupled to the circuit board, where the IC die includes one or more of the memory/IC devices according to any one of the preceding examples (e.g., memory/IC devices according to any one of examples 1-45), and/or the IC die is included in the IC package according to any one of the preceding examples (e.g., the IC package according to any one of examples 46-49).

Example 51 provides the computing device according to example 50, where the computing device is a wearable computing device (e.g., a smart watch) or hand-held computing device (e.g., a mobile phone).

Example 52 provides the computing device according to examples 50 or 51, where the computing device is a server processor.

Example 53 provides the computing device according to examples 50 or 51, where the computing device is a motherboard.

Example 54 provides the computing device according to any one of examples 50-53, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A device comprising:
a first electrode in a first layer, the first electrode comprising ruthenium or iridium;
a second layer over the first layer, the second layer comprising oxygen, strontium, and at least one additional metal;
a third layer over the second layer, the third layer comprising oxygen, strontium, and titanium;

a fourth layer over the third layer, the fourth layer comprising a metal in a second electrode; and
a seed layer for the first electrode, the first electrode between the seed layer and the second layer.

2. The device of claim 1, wherein the second layer comprises a perovskite oxide.

3. The device of claim 1, wherein the first electrode comprises ruthenium, and the at least one additional metal comprises ruthenium.

4. The device of claim 3, wherein the at least one additional metal in the second layer further comprises one of titanium, scandium, rhodium, hafnium, barium, chromium, and iron.

5. The device of claim 1, wherein the first electrode comprises iridium, and the at least one additional metal comprises iridium.

6. The device of claim 5, wherein the at least one additional metal in the second layer further comprises one of titanium, scandium, rhodium, hafnium, barium, chromium, and iron.

7. The device of claim 1, wherein a material in the second layer has a formula $Sr_xB_yO_{3-z}$, B comprises the additional metal, x is between 0.1 and 1, y is between 0.1 and 1, and z is between 0 and 2.9.

8. The device of claim 1, wherein the second electrode comprises ruthenium or iridium.

9. The device of claim 1, wherein the second layer has a thickness between 1.5 and 4 nanometers.

10. The device of claim 1, wherein the first electrode is a first metal electrode, and the second electrode is a second metal electrode.

11. The device of claim 1, wherein the second layer is directly over and in contact with the first layer, and the third layer is directly over and in contact with the second layer.

12. The device of claim 1, wherein the seed layer comprises tantalum.

13. The device of claim 12, wherein the tantalum has a crystalline structure.

14. The device of claim 1, wherein the device is a metal-insulator-metal (MIM) capacitor.

15. The device of claim 14, wherein the first layer, second layer, third layer, and fourth layer extend over a support structure, and the MIM capacitor is a planar capacitor.

16. The device of claim 14, wherein at least a portion of the first layer, a portion of the second layer, a portion of the third layer, and a portion of the fourth layer extend in a direction substantially perpendicular to a support structure, and the MIM capacitor is a trench capacitor.

17. The device of claim 1, wherein the third layer has an equivalent oxide thickness (EOT) between 0.75 and 0.85.

* * * * *